(12) United States Patent
Kim et al.

(45) Date of Patent: Aug. 9, 2011
(10) Patent No.: US 7,994,534 B2

(54) ORGANIC LIGHT EMITTING DISPLAY DEVICE AND A METHOD OF MANUFACTURING THEREOF

(75) Inventors: Deuk Jong Kim, Gyeonggi-do (KR); Seung Yong Song, Gyeonggi-do (KR)

(73) Assignee: Samsung Mobile Display Co., Ltd. (KR)

( * ) Notice: Subject to any disclaimer, the term of this patent is extended or adjusted under 35 U.S.C. 154(b) by 90 days.

(21) Appl. No.: 11/540,366

(22) Filed: Sep. 29, 2006

(65) Prior Publication Data
US 2007/0176171 A1 Aug. 2, 2007

(30) Foreign Application Priority Data
Jan. 27, 2006 (KR) .......................... 10-2006-0008766

(51) Int. Cl.
*H01L 33/52* (2010.01)
(52) U.S. Cl. ............ 257/100; 257/40; 438/99; 313/498; 313/500; 313/504; 313/506; 315/169.1; 315/169.3
(58) Field of Classification Search .................... 257/40, 257/100; 438/99; 313/504, 506, 498, 500; 315/169.1, 169.3
See application file for complete search history.

(56) References Cited

U.S. PATENT DOCUMENTS

| 4,238,704 A | 12/1980 | Bonk et al. |
| 6,555,025 B1 | 4/2003 | Krupetsky et al. |
| 6,998,776 B2 | 2/2006 | Aitken et al. |
| 7,157,850 B2 * | 1/2007 | Miyazaki et al. ............. 313/495 |
| 7,193,366 B2 | 3/2007 | Tomimatsu et al. |
| 7,291,967 B2 | 11/2007 | Sakata et al. |
| 2002/0011798 A1 * | 1/2002 | Sasaki et al. ............... 315/169.1 |
| 2002/0084464 A1 | 7/2002 | Yamazaki et al. |
| 2002/0125484 A1 * | 9/2002 | Silvernail et al. ............... 257/79 |
| 2003/0173891 A1 | 9/2003 | Chiba et al. |
| 2004/0017160 A1 * | 1/2004 | Sagawa et al. ............. 315/169.1 |
| 2004/0075380 A1 | 4/2004 | Takemoto et al. |
| 2004/0150319 A1 | 8/2004 | Tomimatsu et al. |
| 2004/0169174 A1 * | 9/2004 | Huh et al. ........................ 257/40 |

(Continued)

FOREIGN PATENT DOCUMENTS

EP 1503422 2/2005

(Continued)

OTHER PUBLICATIONS

Office Action in U.S. Appl. No. 11/540,083, dated Nov. 18, 2008.

(Continued)

*Primary Examiner* — Thao X Le
*Assistant Examiner* — Tanika Warrior
(74) *Attorney, Agent, or Firm* — Knobbe Martens Olson & Bear LLP (57) ABSTRACT

Disclosed is an organic light emitting display device including a first substrate defining a pixel region and a non-pixel region. An organic light emitting element comprising a first electrode, an organic thin film layer and a second electrode are formed in the pixel region. A scan driver is formed in the non-pixel region. A second substrate is sealed spaced apart from the pixel region and the non-pixel region of the first substrate. A frit is formed along an edge of a non-pixel region of the second substrate, wherein the frit is formed so that it can be overlapped with a region excluding an active area of the scan driver formed in the non-pixel region.

10 Claims, 7 Drawing Sheets

U.S. PATENT DOCUMENTS

| | | |
|---|---|---|
| 2004/0169628 A1 | 9/2004 | Jinno et al. |
| 2004/0206953 A1 | 10/2004 | Morena et al. |
| 2004/0207314 A1 | 10/2004 | Aitken et al. |
| 2005/0052127 A1 | 3/2005 | Sakata |
| 2005/0082963 A1 | 4/2005 | Miyazaki et al. |
| 2005/0153476 A1 | 7/2005 | Park et al. |
| 2005/0233885 A1 | 10/2005 | Yoshida et al. |
| 2005/0236676 A1 | 10/2005 | Ueno |
| 2005/0248270 A1 | 11/2005 | Ghosh et al. |
| 2005/0258772 A1* | 11/2005 | Park et al. ............ 315/169.1 |
| 2005/0280360 A1 | 12/2005 | Park |
| 2006/0061269 A1* | 3/2006 | Tsuchiya et al. ............ 313/506 |
| 2006/0087230 A1* | 4/2006 | Ghosh et al. ............ 313/512 |
| 2007/0176563 A1 | 8/2007 | Kim et al. |
| 2008/0122345 A1* | 5/2008 | Sakata et al. ............ 313/504 |

FOREIGN PATENT DOCUMENTS

| | | |
|---|---|---|
| JP | 09-278483 | 10/1997 |
| JP | 10-074583 | 3/1998 |
| JP | 11-194367 | 7/1999 |
| JP | 2003-255845 | 9/2003 |
| JP | 2004-139767 | 5/2004 |
| JP | 2004-151716 | 5/2004 |
| JP | 2006-524419 | 10/2006 |
| KR | 10-2001-0084380 A | 9/2001 |
| KR | 10-2005-0092934 | 9/2005 |
| KR | 10-2002-0051153 A | 6/2006 |
| TW | I232067 | 5/2005 |
| WO | WO 2004/095597 | 11/2004 |

OTHER PUBLICATIONS

An Office Action dated Nov. 4, 2009 of the Japanese Patent Application No. 2006-240516.

Office Action issued Dec. 29, 2009 in corresponding Taiwan Patent Application No. 95146415.

Chinese Office Action dated Aug. 1, 2008 in Chinese Patent Application No. 2007100019898.

Japanese Office Action dated Nov. 4, 2009 in Japanese Patent Application No. 2006-236171.

Taiwanese Office Action in Application No. 95146822 dated Oct. 19, 2010.

European Search Report dated Jan. 24, 2011 in application No. 07250352.7.

European Search Report dated Jan. 25, 2011 in corresponding application No. 07101149.8.

* cited by examiner

ORGANIC LIGHT EMITTING DISPLAY DEVICE AND A METHOD OF MANUFACTURING THEREOF

CROSS-REFERENCE TO RELATED APPLICATIONS

This application claims the benefit of Korean Patent Application No. 10-2006-0008766, filed on Jan. 27, 2006, in the Korean Intellectual Property Office, the disclosure of which is incorporated herein by reference in its entirety. This application is related to and incorporates herein by reference the entire contents of the following concurrently filed application:

| Title | Filing Date | application Ser. No. |
|---|---|---|
| ORGANIC LIGHT EMITTING DISPLAY DEVICE AND A METHOD OF MANUFACTURING THEREOF | Sep. 29, 2006 | 11/540,083 |

BACKGROUND

1. Field

The invention relates to an organic light emitting display device and a method of manufacturing the same.

2. Discussion of the Related Technology

Generally, an organic light emitting display device is composed of a substrate providing a pixel region and a non-pixel region. A container and a substrate are arranged to face the substrate for encapsulation and coalesced using a sealant such as epoxy.

A plurality of light emitting are elements connected between scan lines and data lines in a matrix arrangement to form a pixel region of the substrate. The light emitting elements are composed of an anode electrode; a cathode electrode; and an organic thin film layer formed between the anode electrode and the cathode electrode to generally include a hole transport layer, an organic emitting layer and an electron transport layer.

Light emitting elements configured as described above are susceptible brittle to hydrogen or oxygen to the organic substance. They are also easily oxidized by moisture in the air since the cathode electrode is formed of metallic materials, and therefore its electrical and light-emission properties are subject to deterioration. Accordingly, moisture penetrated from the outside should be removed in order to inhibit this deterioration by loading a container manufactured in a form of a metallic can or cup, and a substrate such as glass, plastic, etc. with a moisture absorbent in a powdery form or adhering the moisture absorbent, in a form of film, to the container.

However, such a method for loading a container with a moisture absorbent in a powdery form has disadvantages in that its process is complex, the material and manufacturing cost is expensive, a resulting display device is thick, and it is difficult to apply to a top emission display. Also, such methods for adhering the moisture absorbent, in a form of film, to the container has disadvantages in that it is difficult to remove moisture and mass-production is difficult due to low durability and reliability. The above discussion is simply to describe the general field of light emitting displays and is not an identification of prior art.

In order to solve the problems, various methods for encapsulating a light emitting element by forming a side wall with a frit have been disclosed.

International Patent application No. PCT/KR2002/000994 (May 24, 2002) discloses an encapsulation container having a side wall formed of a glass frit; and a method of manufacturing the same.

Korean Patent Publication No. 2001-0084380 (Sep. 6, 2001) discloses a method for encapsulating a frit frame using a laser.

Korean Patent Publication No. 2002-0051153 (Jun. 28, 2002) discloses a packaging method for encapsulating an upper substrate and a lower substrate with a frit using a laser.

SUMMARY OF CERTAIN INVENTIVE ASPECTS

An aspect of the invention provides an organic light emitting device, which may comprise: a first substrate defining a pixel region and a non-pixel region; an array of organic light emitting pixels formed over the pixel region of the first substrate; a second substrate placed over the first substrate, the array being interposed between the first and second substrates; a frit seal comprising a plurality of elongated segments interposed between the first and second substrates, the plurality of elongated segments in combination surrounding the array such that the array is encapsulated by the first substrate, the second substrate and the frit seal, the plurality of elongated segments comprising a first elongated segment elongated generally in a first direction; and a scan driver formed over the non-pixel region and comprising a semiconductive integrated circuit portion, wherein the semiconductive integrated circuit portion and the first elongated segment extend generally parallel to each other without any one of the plurality of elongated segments interposed therebetween when viewed in a second direction from the first or second substrate, wherein the second direction defines the shortest distance between the first and second substrates, and wherein the first elongated segment does not substantially overlap with the semiconductive integrated circuit portion when viewed in the second direction from the first or second substrate.

In the foregoing device, the semiconductive integrated circuit portion may comprise interconnected semiconductive circuit elements. The semiconductive circuit elements may comprise thin film transistors. The device may further comprise a planarization layer formed between the first substrate and the frit, and wherein the scan driver is substantially buried in the planarization layer. The scan driver may comprise non-semiconductive integrated circuit portion, which overlaps with the first elongated segment when viewed in the second direction from the first or second substrate. The semiconductive integrated circuit portion may have a width defined in a third direction perpendicular to the first and second directions, and wherein there may be a gap in the third direction between the semiconductive integrated circuit portion and the first elongated segment when viewed in the second direction from the first or second substrate, and wherein the gap may be smaller than about the width. The width may be from about 0.02 mm to about 0.5 mm. The gap may be smaller than about 0.2 mm. The gap may be smaller than about half the width.

Still in the foregoing device, the semiconductive integrated circuit portion and the first elongated segment may have substantially no gap in the third direction when viewed in the second direction from the first or second substrate. The device may further comprise a signal line portion, wherein the signal line portion may comprise a plurality of conductive lines interconnecting the scan driver and the array, and wherein the first elongated segment may overlap with the signal line portion when viewed in the second direction from the first or second substrate. The scan driver may comprise a routing portion interposed between the semiconductive integrated circuit portion and the signal line portion, and wherein the first elongated segment may overlap with the routing portion when viewed in the second direction from the first or second substrate. The frit seal may comprise one or more materials selected from the group consisting of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate.

Another aspect of the invention provides a method of making an organic light emitting device, which may comprise: providing a first substrate defining a pixel region and a non-pixel region; forming an array of organic light emitting pixels over the pixel region of the first substrate; forming a scan driver over the non-pixel region of the first substrate; arranging a second substrate over the first substrate such that the array being interposed between the first and second substrates; interposing a frit comprising a plurality of elongated segments between the first substrate and second substrate, the plurality of elongated segments in combination surrounding the array, and the plurality of elongated segments comprising a first elongated segment elongated generally in a first direction; and wherein the scan driver comprises a semiconductive integrated circuit portion, wherein the semiconductive integrated circuit portion and the first elongated segment extend generally parallel to each other without any one of the plurality of elongated segments interposed therebetween when viewed in a second direction from the first or second substrate, wherein the second direction defines the shortest distance between the first and second substrates, and wherein the first elongated segment does not substantially overlap with the semiconductive integrated circuit portion when viewed in the second direction from the first or second substrate.

In the foregoing method, the semiconductive integrated circuit portion may comprise interconnected semiconductive circuit elements. The semiconductive circuit elements may comprise thin film transistors. The scan driver may overlap with the first elongated segment when viewed in the second direction from the first or second substrate, The semiconductive integrated circuit portion of the scan driver may have a width defined in a third direction perpendicular to the first and second directions, wherein there may be a gap in the third direction between the semiconductive integrated circuit portion the scan driver and the first elongated segment, and wherein the gap may be smaller than about the width of the scan driver.

Aspects of the invention provide an organic light emitting display device including a first substrate divided into a pixel region and a non-pixel region, wherein an organic light emitting element composed of a first electrode, an organic thin film layer and a second electrode is formed in the pixel region and a scan driver is formed in the non-pixel region; a second substrate sealed spaced apart a predetermined distance from the pixel region and the non-pixel region of the first substrate; and a frit formed along an edge of a non-pixel region of the second substrate, wherein the frit is formed so that it can be overlapped with a region except an active area of the scan driver formed in the non-pixel region.

Other aspects of the invention provides a method for manufacturing an organic light emitting display device, including steps of forming an organic light emitting element composed of a first electrode, an organic thin film layer and a second electrode in the pixel region of the first substrate divided into a pixel region and a non-pixel region and forming a scan driver in the non-pixel region; forming a frit along an edge of a region, which corresponds to the scan driver of the non-pixel region of the first substrate, in a second substrate sealed spaced apart a predetermined distance from the first substrate; arranging the second substrate on the first substrate so that the frit formed in the second substrate can be overlapped with a region except an active area of the scan driver which is a non-pixel region of the first substrate; and adhering the first substrate to the second substrate by irradiating a laser beam to the frit in the back surface of the second substrate.

Other embodiments include an organic light emitting display device comprising a first substrate defining a pixel region and a non-pixel region, wherein an organic light emitting element comprising a first electrode, an organic thin film layer and a second electrode is formed in the pixel region and a scan driver is formed in the non-pixel region, a second substrate sealed spaced apart from the pixel region and the non-pixel region of the first substrate, and a frit formed along an edge of a non-pixel region of the second substrate, wherein the frit is formed so that it can be overlapped with a region excluding an active area of the scan driver formed in the non-pixel region.

Yet other embodiments include a method for manufacturing an organic light emitting display device, comprising providing an organic light emitting element comprising a first electrode, an organic thin film layer and a second electrode in a pixel region of the first substrate, providing a scan driver in a non-pixel region of the first substrate, forming a frit along an edge of a region corresponding to the scan driver of the non-pixel region of the first substrate on a second substrate, arranging the second substrate on the first substrate so that the frit formed on the second substrate is overlapped with a region excluding an active area of the scan driver, and adhering the first substrate to the second substrate by irradiating at least one of a laser and infrared radiation to the frit in a back surface of the second substrate.

Further embodiments include a method of making an organic light emitting device, the method comprising providing an unfinished device comprising a first substrate, an array of organic light emitting pixels formed over the first substrate, and an electrically conductive line formed over the first substrate, providing a scan driver in a non -pixel region of the first substrate, providing a second substrate, interposing a frit between the first and second substrates such that the array is interposed between the first and second substrates and such that the frit surrounds the array, arranging the second substrate on the first substrate so that the frit is overlapped with a region excluding an active area of the scan driver, and melting and resolidifying at least part of the frit so as to interconnect the unfinished device and the second substrate via the frit.

BRIEF DESCRIPTION OF THE DRAWINGS

These and other aspects and advantages of the invention will become apparent and more readily appreciated from the following description of the embodiments, taken in conjunction with the accompanying drawings of which.

DETAILED DESCRIPTION OF EMBODIMENTS

Hereinafter, various embodiments according to the invention will be described in detail with reference to the accompanying drawings. Therefore, the description proposed herein are examples for the purpose of illustrations only, not intended to limit the scope of the invention, so it should be understood that other equivalents and modifications could be made thereto without departing from the spirit and scope of the invention, as apparent to those skilled in the art.

An organic light emitting display (OLED) is a display device comprising an array of organic light emitting diodes. Organic light emitting diodes are solid state devices which include an organic material and are adapted to generate and emit light when appropriate electrical potentials are applied.

Figure 6:
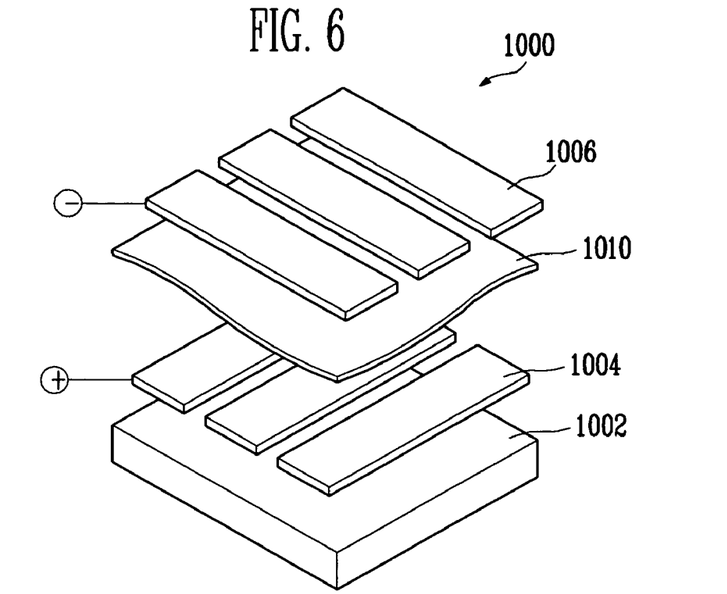
FIG. 6 is a schematic exploded view of a passive matrix type organic light emitting display device in accordance with one embodiment.
Figure 7:
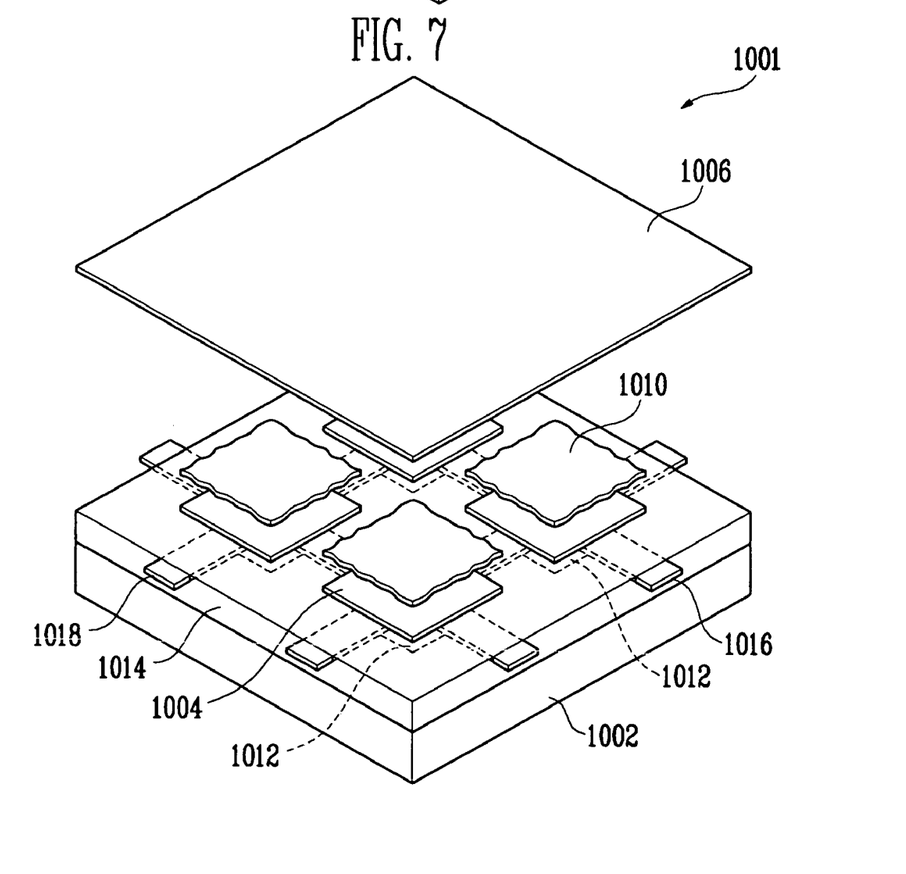
FIG. 7 is a schematic exploded view of an active matrix type organic light emitting display device in accordance with one embodiment.

OLEDs can be generally grouped into two basic types dependent on the arrangement with which the stimulating electrical current is provided. FIG. 6 schematically illustrates an exploded view of a simplified structure of a passive matrix type OLED 1000. FIG. 7 schematically illustrates a simplified structure of an active matrix type OLED 1001. In both configurations, the OLED 1000, 1001 includes OLED pixels built over a substrate 1002, and the OLED pixels include an anode 1004, a cathode 1006 and an organic layer 1010. When an appropriate electrical current is applied to the anode 1004, electric current flows through the pixels and visible light is emitted from the organic layer.

Referring to FIG. 6, the passive matrix OLED (PMOLED) design includes elongate strips of anode 1004 arranged generally perpendicular to elongate strips of cathode 1006 with organic layers interposed therebetween. The intersections of the strips of cathode 1006 and anode 1004 define individual OLED pixels where light is generated and emitted upon appropriate excitation of the corresponding strips of anode 1004 and cathode 1006. PMOLEDs provide the advantage of relatively simple fabrication.

Referring to FIG. 7, the active matrix OLED (AMOLED) includes driving circuits 1012 arranged between the substrate 1002 and an array of OLED pixels. An individual pixel of AMOLEDs is defined between the common cathode 1006 and an anode 1004, which is electrically isolated from other anodes. Each driving circuit 1012 is coupled with an anode 1004 of the OLED pixels and further coupled with a data line 1016 and a scan line 1018. In embodiments, the scan lines 1018 supply scan signals that select rows of the driving circuits, and the data lines 1016 supply data signals for particular driving circuits. The data signals and scan signals stimulate the local driving circuits 1012, which excite the anodes 1004 so as to emit light from their corresponding pixels.

In the illustrated AMOLED, the local driving circuits 1012, the data lines 1016 and scan lines 1018 are buried in a planarization layer 1014, which is interposed between the pixel array and the substrate 1002. The planarization layer 1014 provides a planar top surface on which the organic light emitting pixel array is formed. The planarization layer 1014 may be formed of organic or inorganic materials, and formed of two or more layers although shown as a single layer. The local driving circuits 1012 are typically formed with thin film transistors (TFT) and arranged in a grid or array under the OLED pixel array. The local driving circuits 1012 may be at least partly made of organic materials, including organic TFT. AMOLEDs have the advantage of fast response time improving their desirability for use in displaying data signals. Also, AMOLEDs have the advantages of consuming less power than passive matrix OLEDs.

Referring to common features of the PMOLED and AMOLED designs, the substrate 1002 provides structural support for the OLED pixels and circuits. In various embodiments, the substrate 1002 can comprise rigid or flexible materials as well as opaque or transparent materials, such as plastic, glass, and/or foil. As noted above, each OLED pixel or diode is formed with the anode 1004, cathode 1006 and organic layer 1010 interposed therebetween. When an appropriate electrical current is applied to the anode 1004, the cathode 1006 injects electrons and the anode 1004 injects holes. In certain embodiments, the anode 1004 and cathode 1006 are inverted; i.e., the cathode is formed on the substrate 1002 and the anode is opposingly arranged.

Interposed between the cathode 1006 and anode 1004 are one or more organic layers. More specifically, at least one emissive or light emitting layer is interposed between the cathode 1006 and anode 1004. The light emitting layer may comprise one or more light emitting organic compounds. Typically, the light emitting layer is configured to emit visible light in a single color such as blue, green, red or white. In the illustrated embodiment, one organic layer 1010 is formed between the cathode 1006 and anode 1004 and acts as a light emitting layer. Additional layers, which can be formed between the anode 1004 and cathode 1006, can include a hole transporting layer, a hole injection layer, an electron transporting layer and an electron injection layer.

Hole transporting and/or injection layers can be interposed between the light emitting layer 1010 and the anode 1004. Electron transporting and/or injecting layers can be interposed between the cathode 1006 and the light emitting layer 1010. The electron injection layer facilitates injection of electrons from the cathode 1006 toward the light emitting layer 1010 by reducing the work function for injecting electrons from the cathode 1006. Similarly, the hole injection layer facilitates injection of holes from the anode 1004 toward the light emitting layer 1010. The hole and electron transporting layers facilitate movement of the carriers injected from the respective electrodes toward the light emitting layer.

In some embodiments, a single layer may serve both electron injection and transportation functions or both hole injection and transportation functions. In some embodiments, one or more of these layers are lacking. In some embodiments, one or more organic layers are doped with one or more materials that help injection and/or transportation of the carriers. In embodiments where only one organic layer is formed between the cathode and anode, the organic layer may include not only an organic light emitting compound but also certain functional materials that help injection or transportation of carriers within that layer.

There are numerous organic materials that have been developed for use in these layers including the light emitting layer. Also, numerous other organic materials for use in these layers are being developed. In some embodiments, these organic materials may be macromolecules including oligomers and polymers. In some embodiments, the organic materials for these layers may be relatively small molecules. The skilled artisan will be able to select appropriate materials for each of these layers in view of the desired functions of the individual layers and the materials for the neighboring layers in particular designs.

In operation, an electrical circuit provides appropriate potential between the cathode 1006 and anode 1004. This results in an electrical current flowing from the anode 1004 to the cathode 1006 via the interposed organic layer(s). In one embodiment, the cathode 1006 provides electrons to the adjacent organic layer 1010. The anode 1004 injects holes to the organic layer 1010. The holes and electrons recombine in the organic layer 1010 and generate energy particles called "excitons." The excitons transfer their energy to the organic light emitting material in the organic layer 1010, and the energy is used to emit visible light from the organic light emitting material. The spectral characteristics of light generated and emitted by the OLED 1000, 1001 depend on the nature and composition of organic molecules in the organic layer(s). The composition of the one or more organic layers can be selected to suit the needs of a particular application by one of ordinary skill in the art.

OLED devices can also be categorized based on the direction of the light emission. In one type referred to as "top emission" type, OLED devices emit light and display images through the cathode or top electrode 1006. In these embodiments, the cathode 1006 is made of a material transparent or at least partially transparent with respect to visible light. In certain embodiments, to avoid losing any light that can pass through the anode or bottom electrode 1004, the anode may be made of a material substantially reflective of the visible light. A second type of OLED devices emits light through the anode or bottom electrode 1004 and is called "bottom emission" type. In the bottom emission type OLED devices, the anode 1004 is made of a material which is at least partially transparent with respect to visible light. Often, in bottom emission type OLED devices, the cathode 1006 is made of a material substantially reflective of the visible light. A third type of OLED devices emits light in two directions, e.g. through both anode 1004 and cathode 1006. Depending upon the direction(s) of the light emission, the substrate may be formed of a material which is transparent, opaque or reflective of visible light.

Figure 8:
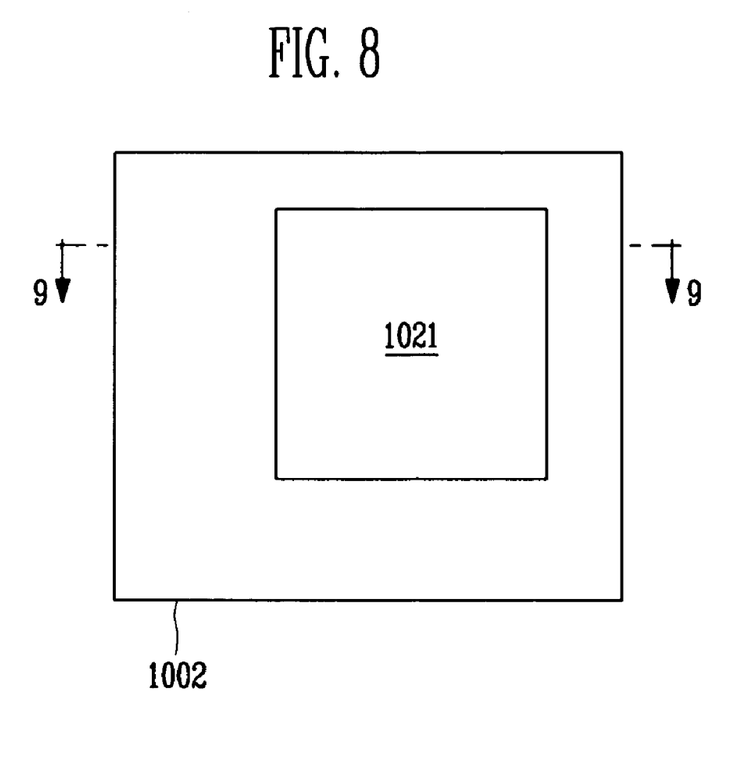
FIG. 8 is a schematic top plan view of an organic light emitting display in accordance with one embodiment.

In many embodiments, an OLED pixel array 1021 comprising a plurality of organic light emitting pixels is arranged over a substrate 1002 as shown in FIG. 8. In embodiments, the pixels in the array 1021 are controlled to be turned on and off by a driving circuit (not shown), and the plurality of the pixels as a whole displays information or image on the array 1021. In certain embodiments, the OLED pixel array 1021 is arranged with respect to other components, such as drive and control electronics to define a display region and a non-display region. In these embodiments, the display region refers to the area of the substrate 1002 where OLED pixel array 1021 is formed. The non-display region refers to the remaining areas of the substrate 1002. In embodiments, the non-display region can contain logic and/or power supply circuitry. It will be understood that there will be at least portions of control/drive circuit elements arranged within the display region. For example, in PMOLEDs, conductive components will extend into the display region to provide appropriate potential to the anode and cathodes. In AMOLEDs, local driving circuits and data/scan lines coupled with the driving circuits will extend into the display region to drive and control the individual pixels of the AMOLEDs.

Figure 9:
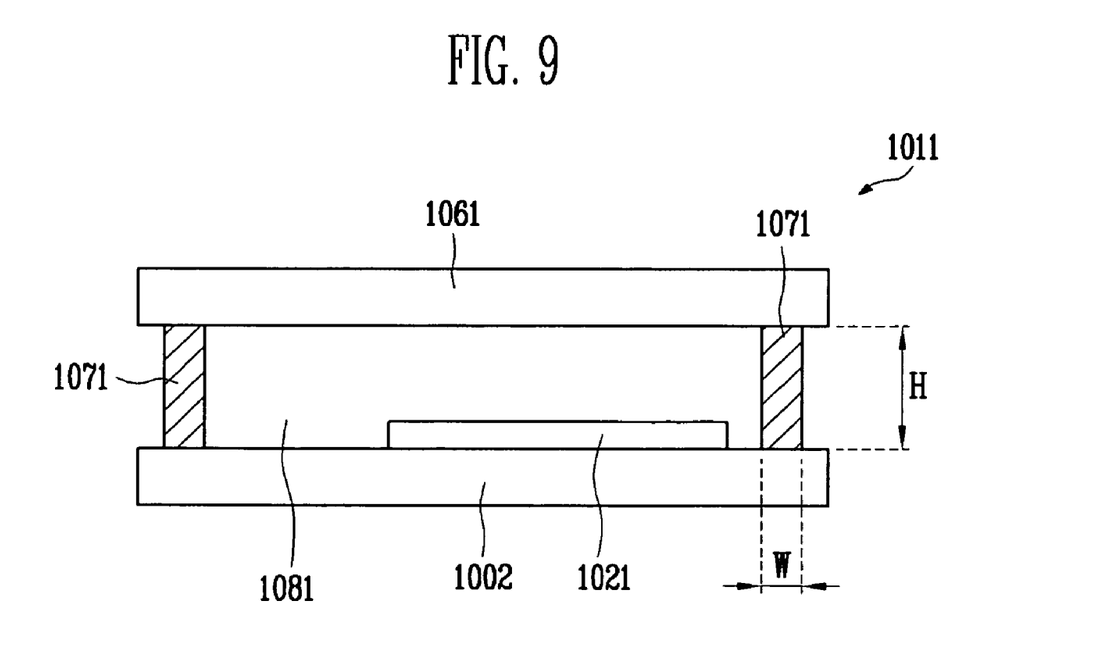
FIG. 9 is a cross-sectional view of the organic light emitting display of FIG. 8, taken along the line 9-9.

One design and fabrication consideration in OLED devices is that certain organic material layers of OLED devices can suffer damage or accelerated deterioration from exposure to water, oxygen or other harmful gases. Accordingly, it is generally understood that OLED devices be sealed or encapsulated to inhibit exposure to moisture and oxygen or other harmful gases found in a manufacturing or operational environment. FIG. 9 schematically illustrates a cross-section of an encapsulated OLED device 1011 having a layout of FIG. 8 and taken along the line 9-9 of FIG. 8. In this embodiment, a generally planar top plate or substrate 1061 engages with a seal 1071 which further engages with a bottom plate or substrate 1002 to enclose or encapsulate the OLED pixel array 1021. In other embodiments, one or more layers are formed on the top plate 1061 or bottom plate 1002, and the seal 1071 is coupled with the bottom or top substrate 1002, 1061 via such a layer. In the illustrated embodiment, the seal 1071 extends along the periphery of the OLED pixel array 1021 or the bottom or top plate 1002, 1061.

In embodiments, the seal 1071 is made of a frit material as will be further discussed below. In various embodiments, the top and bottom plates 1061, 1002 comprise materials such as plastics, glass and/or metal foils which can provide a barrier to passage of oxygen and/or water to thereby protect the OLED pixel array 1021 from exposure to these substances. In embodiments, at least one of the top plate 1061 and the bottom plate 1002 are formed of a substantially transparent material.

To lengthen the life time of OLED devices 1011, it is generally desired that seal 1071 and the top and bottom plates 1061, 1002 provide a substantially non-permeable seal to oxygen and water vapor and provide a substantially hermetically enclosed space 1081. In certain applications, it is indicated that the seal 1071 of a frit material in combination with the top and bottom plates 1061, 1002 provide a barrier to oxygen of less than approximately $10^{-3}$ cc/m$^2$-day and to water of less than $10^{-6}$ g/m$^2$-day. Given that some oxygen and moisture can permeate into the enclosed space 1081, in some embodiments, a material that can take up oxygen and/or moisture is formed within the enclosed space 1081.

The seal 1071 has a width W, which is its thickness in a direction parallel to a surface of the top or bottom substrate 1061, 1002 as shown in FIG. 9. The width varies among embodiments and ranges from about 300 μm to about 3000 μm, optionally from about 500 μm to about 1500 μm. Also, the width may vary at different positions of the seal 1071. In some embodiments, the width of the seal 1071 may be the largest where the seal 1071 contacts one of the bottom and top substrate 1002, 1061 or a layer formed thereon. The width may be the smallest where the seal 1071 contacts the other. The width variation in a single cross-section of the seal 1071 relates to the cross-sectional shape of the seal 1071 and other design parameters.

The seal 1071 has a height H, which is its thickness in a direction perpendicular to a surface of the top or bottom substrate 1061, 1002 as shown in FIG. 9. The height varies among embodiments and ranges from about 2 μm to about 30 μm, optionally from about 10 μm to about 15 μm. Generally, the height does not significantly vary at different positions of the seal 1071. However, in certain embodiments, the height of the seal 1071 may vary at different positions thereof.

In the illustrated embodiment, the seal 1071 has a generally rectangular cross-section. In other embodiments, however, the seal 1071 can have other various cross-sectional shapes such as a generally square cross-section, a generally trapezoidal cross-section, a cross-section with one or more rounded edges, or other configuration as indicated by the needs of a given application. To improve hermeticity, it is generally desired to increase the interfacial area where the seal 1071 directly contacts the bottom or top substrate 1002, 1061 or a layer formed thereon. In some embodiments, the shape of the seal can be designed such that the interfacial area can be increased.

The seal 1071 can be arranged immediately adjacent the OLED array 1021, and in other embodiments, the seal 1071 is spaced some distance from the OLED array 1021. In certain embodiment, the seal 1071 comprises generally linear segments that are connected together to surround the OLED array 1021. Such linear segments of the seal 1071 can extend, in certain embodiments, generally parallel to respective boundaries of the OLED array 1021. In other embodiment, one or more of the linear segments of the seal 1071 are arranged in a non-parallel relationship with respective boundaries of the OLED array 1021. In yet other embodiments, at least part of the seal 1071 extends between the top plate 1061 and bottom plate 1002 in a curvilinear manner.

As noted above, in certain embodiments, the seal 1071 is formed using a frit material or simply "frit" or "glass frit," which includes fine glass particles. The frit particles includes one or more of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate, etc. In embodiments, these particles range in size from about 2 μm to about 30 μm, optionally about 5 μm to about 10 μm, although not limited only thereto. The particles can be as large as about the distance between the top and bottom substrates 1061, 1002 or any layers formed on these substrates where the frit seal 1071 contacts.

The frit material used to form the seal 1071 can also include one or more filler or additive materials. The filler or additive materials can be provided to adjust an overall thermal expansion characteristic of the seal 1071 and/or to adjust the absorption characteristics of the seal 1071 for selected frequencies of incident radiant energy. The filler or additive material(s) can also include inversion and/or additive fillers to adjust a coefficient of thermal expansion of the frit. For example, the filler or additive materials can include transition metals, such as chromium (Cr), iron (Fe), manganese (Mn), cobalt (Co), copper (Cu), and/or vanadium. Additional materials for the filler or additives include $ZnSiO_4$, $PbTiO_3$, $ZrO_2$, eucryptite.

In embodiments, a frit material as a dry composition contains glass particles from about 20 to 90 about wt %, and the remaining includes fillers and/or additives. In some embodiments, the frit paste contains about 10-30 wt % organic materials and about 70-90% inorganic materials. In some embodiments, the frit paste contains about 20 wt % organic materials and about 80 wt % inorganic materials. In some embodiments, the organic materials may include about 0-30 wt % binder(s) and about 70-100 wt % solvent(s). In some embodiments, about 10 wt % is binder(s) and about 90 wt % is solvent(s) among the organic materials. In some embodiments, the inorganic materials may include about 0-10 wt % additives, about 20-40 wt % fillers and about 50-80 wt % glass powder. In some embodiments, about 0-5 wt % is additive(s), about 25-30 wt % is filler(s) and about 65-75 wt % is the glass powder among the inorganic materials.

In forming a frit seal, a liquid material is added to the dry frit material to form a frit paste. Any organic or inorganic solvent with or without additives can be used as the liquid material. In embodiments, the solvent includes one or more organic compounds. For example, applicable organic compounds are ethyl cellulose, nitro cellulose, hydroxyl propyl cellulose, butyl carbitol acetate, terpineol, butyl cellusolve, acrylate compounds. Then, the thus formed frit paste can be applied to form a shape of the seal 1071 on the top and/or bottom plate 1061, 1002.

In one exemplary embodiment, a shape of the seal 1071 is initially formed from the frit paste and interposed between the top plate 1061 and the bottom plate 1002. The seal 1071 can in certain embodiments be pre-cured or pre-sintered to one of the top plate and bottom plate 1061, 1002. Following assembly of the top plate 1061 and the bottom plate 1002 with the seal 1071 interposed therebetween, portions of the seal 1071 are selectively heated such that the frit material forming the seal 1071 at least partially melts. The seal 1071 is then allowed to resolidify to form a secure joint between the top plate 1061 and the bottom plate 1002 to thereby inhibit exposure of the enclosed OLED pixel array 1021 to oxygen or water.

In embodiments, the selective heating of the frit seal is carried out by irradiation of light, such as a laser or directed infrared lamp. As previously noted, the frit material forming the seal 1071 can be combined with one or more additives or filler such as species selected for improved absorption of the irradiated light to facilitate heating and melting of the frit material to form the seal 1071.

Figure 10:
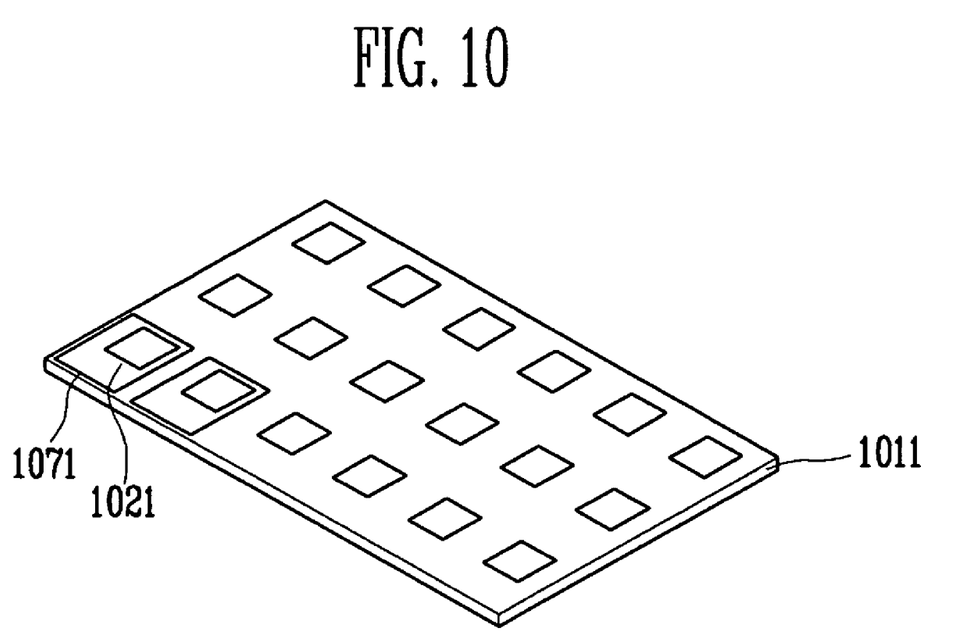
FIG. 10 is a schematic perspective view illustrating mass production of organic light emitting devices in accordance with one embodiment.

In some embodiments, OLED devices 1011 are mass produced. In an embodiment illustrated in FIG. 10, a plurality of separate OLED arrays 1021 is formed on a common bottom substrate 1101. In the illustrated embodiment, each OLED array 1021 is surrounded by a shaped frit to form the seal 1071. In embodiments, common top substrate (not shown) is placed over the common bottom substrate 1101 and the structures formed thereon such that the OLED arrays 1021 and the shaped frit paste are interposed between the common bottom substrate 1101 and the common top substrate. The OLED arrays 1021 are encapsulated and sealed, such as via the previously described enclosure process for a single OLED display device. The resulting product includes a plurality of OLED devices kept together by the common bottom and top substrates. Then, the resulting product is cut into a plurality of pieces, each of which constitutes an OLED device 1011 of FIG. 9. In certain embodiments, the individual OLED devices 1011 then further undergo additional packaging operations to further improve the sealing formed by the frit seal 1071 and the top and bottom substrates 1061, 1002.

Figure 1:
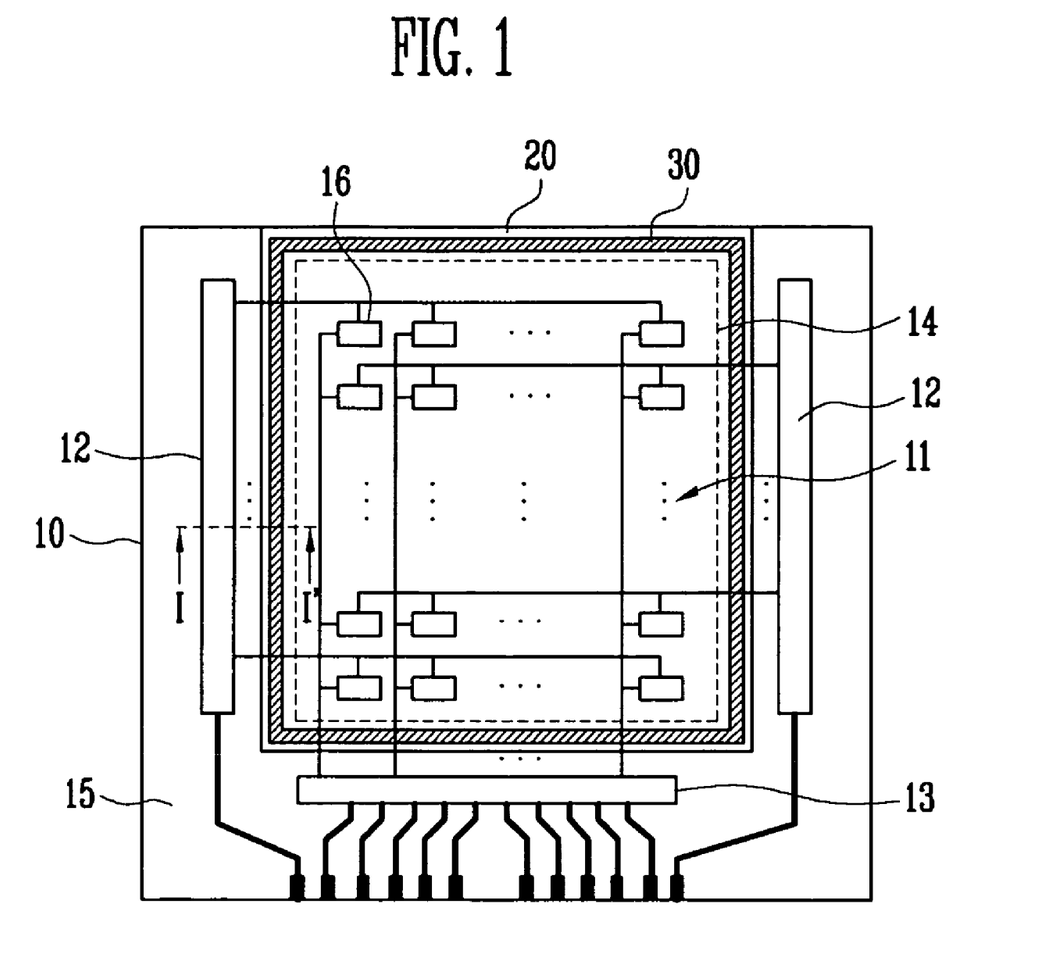
FIG. 1 is a plane view showing an organic light emitting display device according to the prior art.
Figure 2:
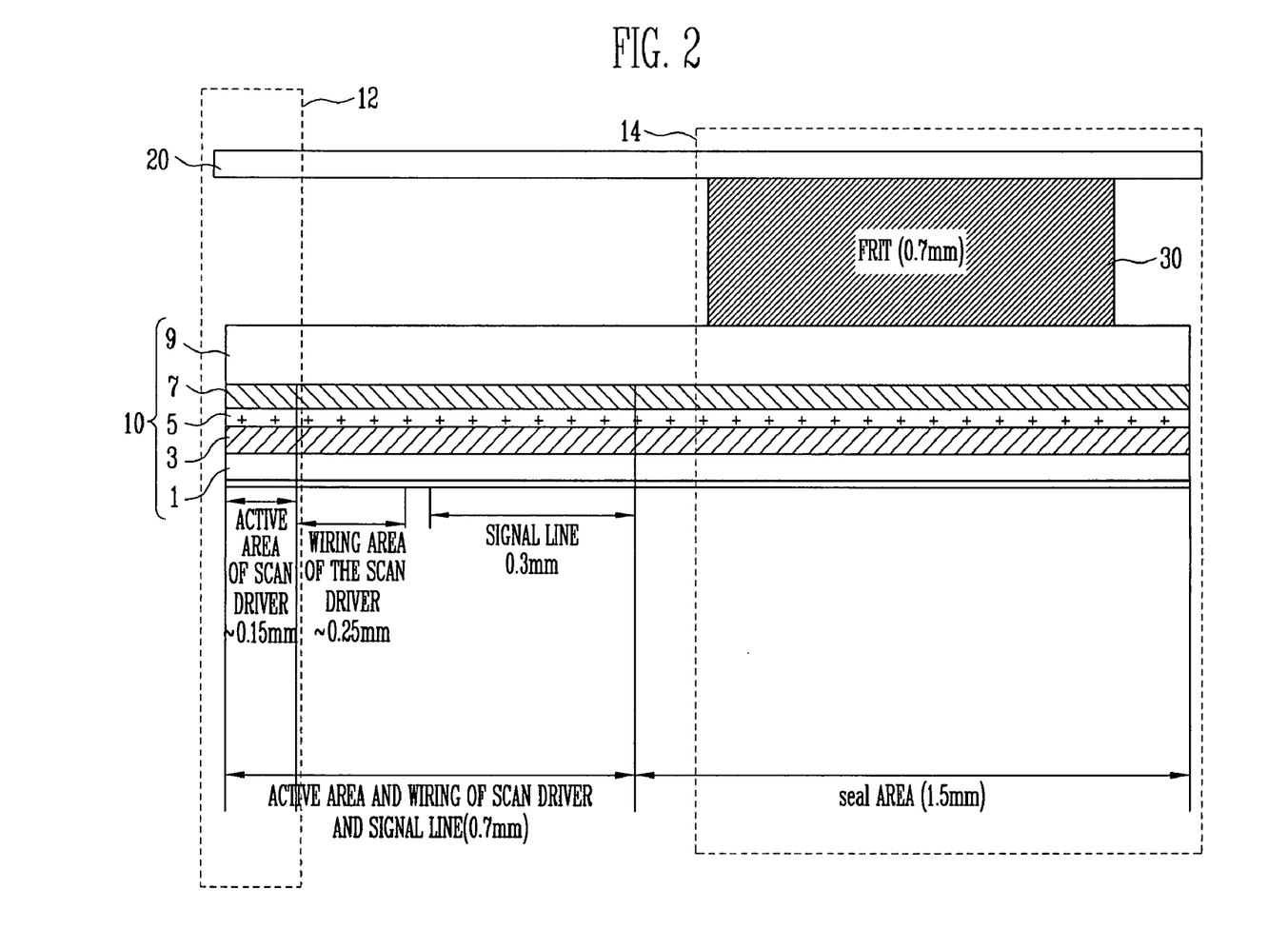
FIG. 2 is a cross-sectional view taken from a line I-I' of the FIG. 1.

FIG. 1 is a plan view showing one embodiment of an organic light emitting display device. FIG. 2 is a cross-sectional view taken from a line I-I' of the FIG. 1. As shown in FIG. 1 and FIG. 2, the organic light emitting display device comprises a deposition substrate 10, an encapsulation substrate 20 and a frit 30. The deposition substrate 10 is a substrate including a pixel region 11 including at least one organic light emitting element. A non-pixel region 15 formed in a circumference of the pixel region 11. The encapsulation substrate 20 is adhered against a surface in which an organic light emitting element 16 of the deposition substrate 10 is formed. Drives such as a scan driver 12 and a data driver 13 are formed in the non-pixel region 15 of the deposition substrate 10, respectively.

In order to adhere the deposition substrate 10 to the encapsulation substrate 20, the frit 30 is applied along edges of the deposition substrate 10 and the encapsulation substrate 20. The frit 30 is also cured using methods such as irradiation of a laser beam or an ultraviolet ray, etc. Because the frit 30 is applied, hydrogen, oxygen, moisture, etc. that penetrate between a fine gap are obstructed since an encapsulating material is formed additionally.

In one embodiment, the organic light emitting display device has a scan driver (width about 0.4 mm) and a signal line portion (width about 0.3 mm) formed in a non-pixel region 15. A frit (width about 0.7 mm) 30 is formed in a region of a seal (width about 1.5 mm) 14 between the pixel region 11 and the non-pixel region 15. An active area of the scan driver has a width of approximately 0.15 mm, and a wiring area of the scan driver has a width of approximately 0.25 mm. The active area of the scan driver refers to a semiconductive integrated circuit portion, which creates scan signals. The signal lines refer to a plurality of conductive lines extending from the scan driver to the pixels. The wiring area of the scan driver refers to a portion of the scan driver that is located between the semiconductive integrated circuit portion and the signal lines. In the non-pixel region, a dead space region may be formed in a wide range as described above, then the organic light emitting display device would desirably have an even smaller size.

Accordingly, certain embodiments provide an organic light emitting display device capable of reducing a dead space by forming a frit so that the frit can be overlapped with one region of a scan driver; and a method of manufacturing the same.

Figure 3:
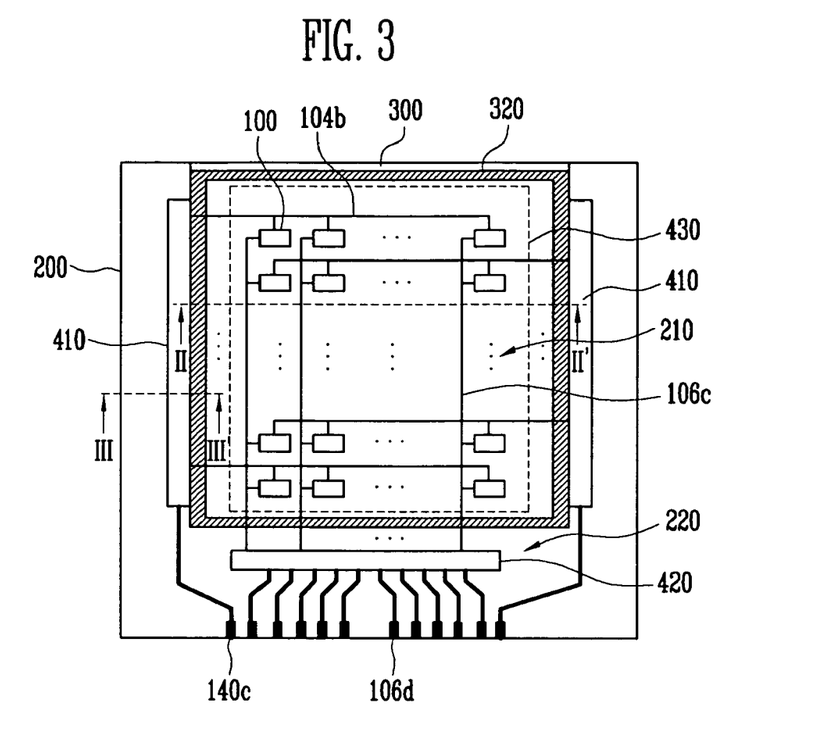
FIG. 3 is a plane view showing one embodiment of an organic light emitting display device according to the invention.

FIG. 3 is a plan view showing one embodiment of an organic light emitting display device. As shown in FIG. 3, an organic light emitting display device is divided into a pixel region 210 and a non-pixel region 220. An organic light emitting element comprising a first electrode, an organic thin film layer and a second electrode is formed in the pixel region 210. The non-pixel region 220 includes a first substrate 200 in which a scan driver 410 is formed. A second substrate 300 is sealed and spaced apart from the pixel region 210 and the non-pixel region 220 of the first substrate 200. A frit 320 is formed in spaced gaps of the non-pixel regions of the first substrate 200 and the second substrate 300 and formed so that it can be overlapped with a region excluding an active area of the scan driver 410 of the first substrate 200.

The first substrate 200 of the organic light emitting display device defines a pixel region 210 and a non-pixel region 220 surrounding the pixel region 210. In the pixel region 210 of the first substrate 200 are formed a plurality of organic light emitting elements 100 connected between a scan line 104b and a data line 106c in a matrix type arrangement. In the non-pixel region 220 of the first substrate 200 are formed a scan line 104b and a data line 106c extending from the scan line 104b and the data line 106c of the pixel region 210. A power supply line (not shown) for operating an organic light emitting element 100, a scan drive unit 410 and a data drive unit 420 for treating signals, are provided from the outside through pads 104c and 106d, to supply the signals to the scan line 104b and the data line 106c.

Figure 4:
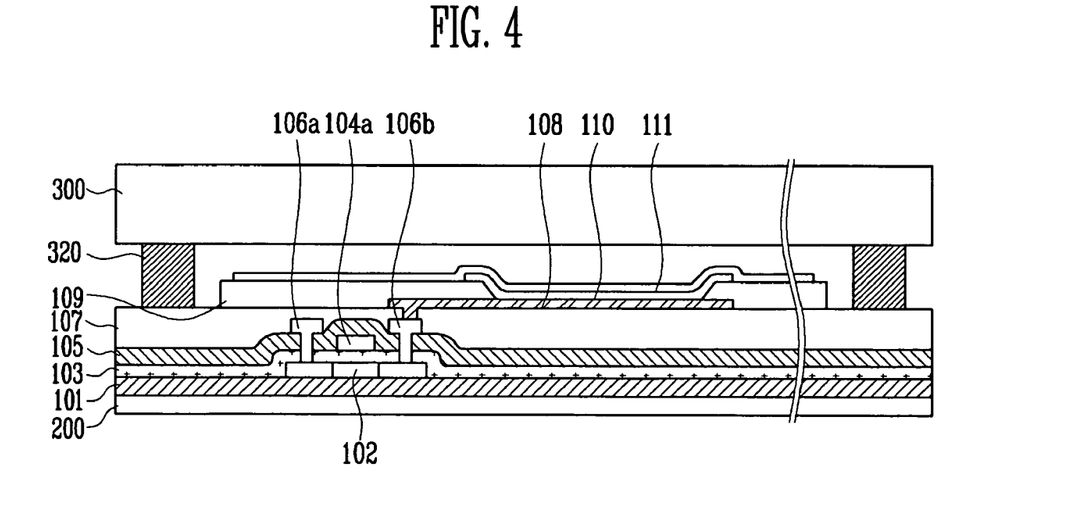
FIG. 4 is a cross-sectional view taken from a line II-II' of the FIG. 3.

FIG. 4 is a cross-sectional view taken from a line II-II'. As shown in FIG. 4, the organic light emitting element 100 formed in the pixel region comprises an anode electrode 108, a cathode electrode 111, and an organic thin film layer 110 formed between the anode electrode 108 and the cathode electrode 111. The organic thin film layer 110 has a structure in which a hole transport layer, an organic emitting layer and an electron transport layer are laminated, and may further include a hole injection layer and an electron injection layer. The organic thin film layer 110 may further include a switching transistor for controlling an operation of the organic light emitting diode 100, and a capacitor for sustaining signals.

Hereinafter, a process of manufacturing an organic light emitting element 100 will be described in detail, as follows. A buffer layer 101 is formed on a substrate 200 defining the pixel region 210 and non-pixel region 220. The buffer layer 101 inhibits the substrate 200 from being damaged by the heat and obstructs ions from being diffused from the substrate 200. The buffer layer comprises insulation films such as a silicon oxide film ($SiO_2$) and/or a silicon nitride film (SiNx). A semiconductor layer 102 defining an active layer is formed in a region on the buffer layer 101 of the pixel region 210. A gate insulation film 103 is formed in the upper surface of the pixel region 210 including the semiconductor layer 102.

A gate electrode 104a is formed on the gate insulation film 103 in the upper portion of the semiconductor layer 102. In the pixel region 210 is formed a scan line 104b connected with the gate electrode 104a. In the non-pixel region 220 are formed a scan line 104b extending from the scan line 104b of the pixel region 210 and a pad 104c for receiving signals from the outside. The gate electrode 104a, the scan line 104b and the pad 104c comprise metals such as molybdenum (Mo), tungsten (W), titanium (Ti), aluminum (Al), etc., alloys thereof, and/or are formed with a laminated structure.

An interlayer insulation film 105 is formed in upper surfaces of the pixel region 210 and the non-pixel region 220 which include the gate electrode 104a, respectively. The interlayer insulation film 105 and the gate insulation film 103 are patterned to form a contact hole so as to expose a region of the semiconductor layer 102. A source and drain electrodes 106a and 106b are formed so that they can be connected with the semiconductor layer 102 through the contact hole. In the pixel region 210 is formed a data line 106c connected with the source and drain electrodes 106a and 106b. In the non-pixel region 220 is formed a data line 106c extending from the data line 106c of the pixel region 210 and a pad 106d for receiving signals from the outside. The source and drain electrodes 106a and 106b, the data line 106c and the pad 106d comprise metals such as molybdenum (Mo), tungsten (W), titanium (Ti), aluminum (Al), etc., alloys thereof, and/or are formed with a laminated structure.

An overcoat 107 is formed in the upper surfaces of the pixel region 210 and the non-pixel region 220 to flatten the surfaces. The overcoat 107 of the pixel region 210 is patterned to form a via hole so as to expose a region of the source or drain electrodes 106a or 106b. An anode electrode 108 is connected with the source or drain electrodes 106a or 106b through the via hole. An organic thin film layer 110 is formed on the overcoat 107 so as to expose a region of the anode electrode 108. An organic thin film layer 110 is formed on the exposed anode electrode 108. A cathode electrode 111 is formed on a pixel definition layer 109 including the organic thin film layer 110. A sealing substrate having a suitable size so that the second substrate 300 is overlapped with some regions of the pixel region 210 and the non-pixel region 220. A substrate composed of transparent materials such as glass may be used as the second substrate 300. In one embodiment, the substrate comprises silicon oxide ($SiO_2$).

Figure 5:
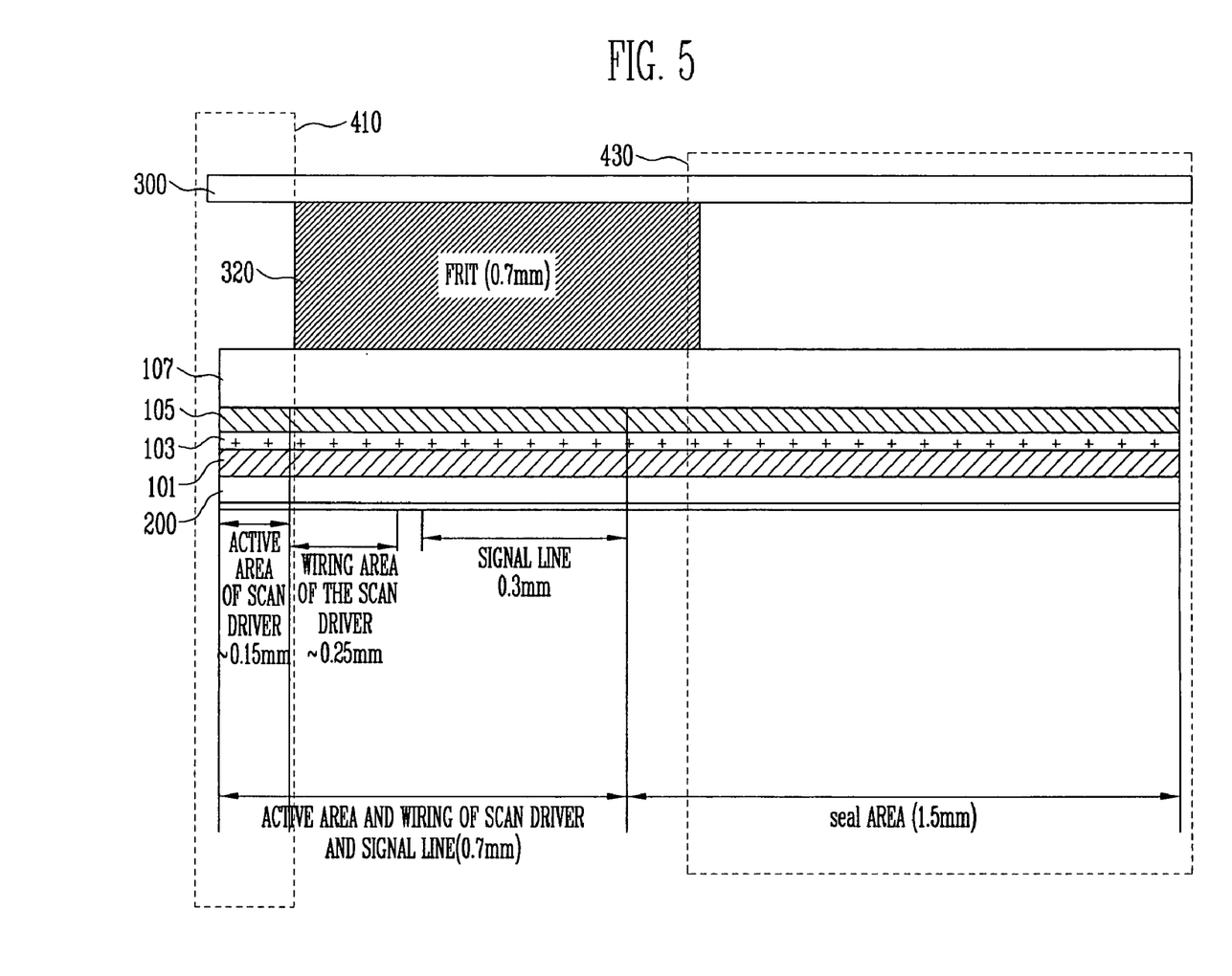
FIG. 5 is a cross-sectional view taken from a line III-III' of the FIG. 3.

FIG. 5 is a cross-sectional view taken from a line III-III'. As shown in FIG. 5, a frit 320 for encapsulation is formed along an edge of the second substrate 300 corresponding to the non-pixel region 220. Here, the frit has a width of approximately 0.7 mm, and is formed so that it can be overlapped with a region excluding an active area of the scan driver 410.

In one embodiment, the scan driver 410 in the non-pixel region 220 includes an scan driver active area, a scan driver wiring area and a signal lines. The scan driver 410 has a width of approximately 0.7 mm, wherein the active area of the scan driver has a width of approximately 0.15 mm, the scan driver wiring area has a width of approximately 0.25 mm, and the signal line portion has a width of approximately 0.3 mm. The frit 320 is formed so that its width can be overlapped with the scan driver wiring area and the signal, line portion by widths of approximately 0.25 mm and approximately 0.3 mm, respectively.

The frit 320 is not formed in a region of a seal (1.5 mm) 430, but formed to the extent of a region excluding the active area of the scan driver. Therefore a dead space may be reduced by approximately 0.55 mm, and a dead space in another side in which another scan driver is formed is also reduced. Therefore a dead space may be reduced by the total width of approximately 1.1 mm in the both sides. The frit 320 is formed on a buffer layer 101, a gate insulation film 103, an interlayer insulation film 105 and an overcoat 107, which are extended together with the pixel region 210 and sequentially formed to the extent of the non-pixel region 220.

The frit 320 inhibits hydrogen and oxygen and moisture from penetrating by encapsulating the pixel region 210 and is formed to surround a region of the non-pixel region 220 including the pixel region 210. A reinforcing absorbent may be further formed in an edge region in which the frit 320 is formed. In one embodiment, the frit 320 comprises a powdery glass material.

A glass frit paste 320 is doped with at least one kind of a transition metal using a screen printing or dispensing method and is applied at a height of approximately 14 to 15 mm and a width of approximately 0.6 to 0.7 mm. Moisture and/or an organic binder is removed and the frit paste 320 is plasticized to cure the glass frit.

The second substrate 300 is arranged on the first substrate 200, in which the organic light emitting element 100 is formed, so that the second substrate 300 can be overlapped with at least certain regions of the pixel region 210 and the non-pixel region 220. The frit 320 is melted and adhered to the first substrate 200 by irradiating a laser along the frit 320 in the back surface of the second substrate 300. In one embodiment, the laser beam is irradiated at a power of approximately 36 to 38 W. The laser beam is scanned along the frit 320 at a substantially constant speed, for example at a speed of 10 to 30 mm/sec, preferably approximately 20 mm/sec so as to sustain a more uniform melting temperature and adhesive force. The laser beam is preferably not irradiated to patterns such as a metal line on the substrate 200 of the non-pixel region 220 corresponding to the frit 320.

In one embodiment, the frit 320 is formed to encapsulate only a pixel region 210. In another embodiment, the frit 320 is formed to encapsulate a scan drive unit 410 wherein a size of the sealing substrate 300 is varied accordingly. The first 320 can be formed in the sealing substrate 300 and may also be formed in the substrate 200. The laser can be used for melting the frit 320 and then adhering it to the substrate 200, but other power sources such as an infrared ray may be used as well.

As described above, embodiments of the invention are described in detail referring to the accompanying drawings. It should be understood that the terms used in the specification and appended claims should not be construed as limited to general and dictionary meanings, but be interpreted based on the meanings and concepts corresponding to technical aspects of the invention on the basis of the principle that the inventor is allowed to define terms appropriately for the best explanation. Therefore, the description herein is simple examples for the purpose of illustrations only, and not intended to limit the scope of the invention. It should be understood that other equivalents and modifications could be made thereto without departing from the spirit and scope of the invention.

What is claimed is:

1. An organic light emitting device comprising:
a first substrate defining a pixel region and a non-pixel region;
an array of organic light emitting pixels formed over the pixel region of the first substrate;
a second substrate placed over the first substrate, the array being interposed between the first and second substrates;
a frit seal comprising a plurality of elongated segments interposed between the first and second substrates and disposed in the non-pixel region, the plurality of elongated segments in combination surrounding the array such that the array is encapsulated by the first substrate, the second substrate and the frit seal, the plurality of elongated segments comprising a first elongated segment elongated generally in a first direction;
a scan driver formed over the non-pixel region and comprising a semiconductive integrated circuit portion and a non-semiconductive integrated circuit portion, wherein the semiconductive integrated circuit portion and the first elongated segment extend generally parallel to each other without any one of the plurality of elongated segments interposed therebetween when viewed in a second direction from the first or second substrate, wherein the second direction defines the shortest distance between the first and second substrates, and wherein the first elongated segment does not overlap with the semiconductive integrated circuit portion and overlaps with the non-semiconductive integrated circuit portion when viewed in the second direction from the first or second substrate; and
a signal line portion, wherein the signal line portion comprises a plurality of conductive lines interconnecting the scan driver and the array, wherein the signal line portion is not formed over the pixel region, and wherein the first elongated segment overlaps with the signal line portion when viewed in the second direction from the first or second substrate,
wherein the semiconductive integrated circuit portion has a width defined in a third direction perpendicular to the first and second directions, and wherein the semiconductive integrated circuit portion and the first elongated segment have substantially no gap in the third direction when viewed in the second direction from the first or second substrate.

2. The device of claim 1, wherein the semiconductive integrated circuit portion comprises interconnected semiconductive circuit elements.

3. The device of claim 2, wherein the semiconductive circuit elements comprise thin film transistors.

4. The device of claim 1, further comprising a planarization layer formed between the first substrate and the frit, and wherein the scan driver is substantially buried in the planarization layer.

5. The device of claim 1, wherein the width is from about 0.02 mm to about 0.5 mm.

6. The device of claim 1, wherein the scan driver comprises a routing portion interposed between the semiconductive integrated circuit portion and the signal line portion, and wherein the first elongated segment overlaps with the routing portion when viewed in the second direction from the first or second substrate.

7. The device of claim 1, wherein the frit seal comprises one or more materials selected from the group consisting of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate.

8. A method of making an organic light emitting device, the method comprising:
providing a first substrate defining a pixel region and a non-pixel region;
forming an array of organic light emitting pixels over the pixel region of the first substrate;
forming a scan driver over the non-pixel region of the first substrate;
arranging a second substrate over the first substrate such that the array being interposed between the first and second substrates;
interposing a frit comprising a plurality of elongated segments between the first substrate and second substrate and in the non-pixel region, the plurality of elongated segments in combination surrounding the array, and the plurality of elongated segments comprising a first elongated segment elongated generally in a first direction;
wherein the scan driver comprises a semiconductive integrated circuit portion and a non-semiconductive integrated circuit portion, wherein the semiconductive integrated circuit portion and the first elongated segment extend generally parallel to each other without any one of the plurality of elongated segments interposed therebetween when viewed in a second direction from the first or second substrate, wherein the second direction defines the shortest distance between the first and second substrates, and wherein the first elongated segment does not overlap with the semiconductive integrated circuit portion and overlaps with the non-semiconductive integrated circuit portion when viewed in the second direction from the first or second substrate; and
wherein the device comprises a signal line portion, wherein the signal line portion comprises a plurality of conductive lines interconnecting the scan driver and the array, wherein the signal line portion is not formed over the pixel region, wherein the first elongated segment overlaps with the signal line portion when viewed in the second direction from the first or second substrate, wherein the semiconductive integrated circuit portion has a width defined in a third direction perpendicular to the first and second directions, and wherein the semiconductive integrated circuit portion and the first elongated segment have substantially no gap in the third direction when viewed in the second direction from the first or second substrate.

9. The method of claim 8, wherein the semiconductive integrated circuit portion comprises interconnected semiconductive circuit elements.

10. The method of claim 8, wherein the semiconductive circuit elements comprise thin film transistors.

* * * * *